(12) United States Patent
Hanson

(10) Patent No.: US 8,558,117 B2
(45) Date of Patent: Oct. 15, 2013

(54) ELECTROCONDUCTIVE INKS MADE WITH METALLIC NANOPARTICLES

(75) Inventor: Eric L. Hanson, Carlsbad, CA (US)

(73) Assignee: Aculon, Inc., San Diego, CA (US)

( * ) Notice: Subject to any disclaimer, the term of this patent is extended or adjusted under 35 U.S.C. 154(b) by 379 days.

(21) Appl. No.: 12/931,242

(22) Filed: Jan. 27, 2011

(65) Prior Publication Data

US 2011/0198113 A1    Aug. 18, 2011

Related U.S. Application Data

(60) Provisional application No. 61/337,960, filed on Feb. 13, 2010.

(51) Int. Cl.
*H05K 1/03* (2006.01)
*H05K 1/09* (2006.01)
*H05K 3/02* (2006.01)
*H05K 3/10* (2006.01)

(52) U.S. Cl.
USPC ............................. 174/256; 174/259; 29/846

(58) Field of Classification Search
USPC ............................. 174/256–259; 29/846–853
See application file for complete search history.

(56) References Cited

U.S. PATENT DOCUMENTS

| | | | |
|---|---|---|---|
| 2008/0003363 A1 | 1/2008 | Park et al. | 427/256 |
| 2008/0020317 A1 | 1/2008 | Park et al. | 430/138 |
| 2008/0265414 A1 | 10/2008 | Ho et al. | 257/741 |

*Primary Examiner* — Jeremy Norris
(74) *Attorney, Agent, or Firm* — William J. Uhl

(57) ABSTRACT

An electroconductive ink made with metallic nanoparticles is disclosed. The ink contains an organophosphorus acid that increases adhesion between the deposited metallic layer and the substrate to which the metallic layer is applied.

23 Claims, No Drawings

US 8,558,117 B2

ELECTROCONDUCTIVE INKS MADE WITH METALLIC NANOPARTICLES

CROSS REFERENCE TO RELATED APPLICATIONS

The present application claims priority from U.S. Provisional Patent Application Ser. No. 61/337,960, filed Feb. 13, 2010.

FIELD OF THE INVENTION

The present invention relates to electroconductive compositions made with metallic nanoparticles such as electroconductive inks, and more particularly to such compositions with improved adhesion to substrates to which the compositions are applied. The invention also relates to a process for applying the compositions to substrates such as would be used in making electronic devices. The invention further relates to an electronic device made by such a process.

BACKGROUND OF THE INVENTION

Printed conductive films have the potential to lower manufacturing costs for microelectronics and large area electronics. Recently, metal nanoparticles having consistent size and shape have been developed. These nanoparticles may be used to prepare well-dispersed inks. These metallic ink dispersions may be used for printing conductors, thereby making the direct writing of electronic circuits possible. Silver and gold nanoparticle-based inks are beginning to be used for printing electronics. These metals are used because of their relatively high stabilities toward oxidation by molecular oxygen. Copper also has been extensively used for electronics and microelectronic chips. Although copper is less costly than silver or gold, oxidation of copper nanoparticles during printing and curing limits its usefulness.

Conductive inks are mainly classified into firing type conductive inks and polymer type conductive inks. The firing type conductive inks develop conductivity by heating to about 200 to 400° C., and thereby metal particles are sintered to each other and a continuous conductive layer can be obtained. However, adhesion to substrates is poor. The polymer type conductive inks contain resin that improves adhesion to a substrate. When the resin in the polymer type conductive ink cures the metal particles simultaneously contact each other and a conductive film is formed.

However, cured resin is an insulating material and intervenes between the metal particles. Consequently, the resultant film has relatively poor electrical conductivity. Indeed even the best silver-based conductive epoxies exhibit conductivities that are several orders of magnitude smaller than pure silver.

Therefore, it would be desirable to develop electroconductive ink that has excellent electrical conductivity such as obtained with sintered metal nanoparticles along with excellent adhesion to the substrate to which the ink is applied.

SUMMARY OF THE INVENTION

The present invention provides for a metal nanoparticle composition that can be made electroconductive, such as electroconductive ink. The composition comprises a dispersion of metal nanoparticles; preferably silver nanoparticles, with a dispersant on the surface of the nanoparticle. Also present in the composition is an organophosphorus acid, such as an organophosphonic acid and preferably an organophosphorus acid in which the organo groups are substituted with omega functional groups. The organophosphorus compound is not acting as a dispersant or surface modifier for the nanoparticles, rather it is acting as a coupling agent forming a chemical link from the substrate surface to the metallic film formed from the nanoparticles during the sintering process.

The invention also provides for a process for depositing the metal nanoparticle composition on a substrate such as would be done in making an electronic device. The process comprises:
 a) depositing the composition as described immediately above on the substrate followed by
 b) heating to form an electrically conductive layer.

The invention also provides for the electronic devices prepared by the process described above.

DETAILED DESCRIPTION

The metal nanoparticles used in the practice of the invention may be, for example, copper, silver, gold and/or palladium, including various combinations thereof. However, silver and gold, because of their resistance to oxidation, are preferred. Because of cost, silver is the most preferred. The metallic nanoparticles have particle size less than 1000 nanometers, typically from 1 to 500 nanometers. The particle size being the average diameter of the particles with a dispersant on their surface as described more fully below and as determined by transmission electron microscopy.

To prevent the metallic nanoparticles from agglomerating, the particles are prepared with a dispersant adsorbed on the surface of the metallic nanoparticle. The dispersant has a portion that is attracted to the metal nanoparticle surface and a tail that is attracted to the diluent into which the metallic nanoparticles are dispersed. Examples of suitable dispersants are alkylamines containing at least 4 carbon atoms, such as 4 to 20 carbon atoms, such as butylamine, hexylamine and dodecylamine; alcohols such as terpinol and polyvinyl alcohol, thiols such as butanethiol and hexanethiol. For gold and silver, particularly silver nanoparticles, the preferred stabilizers are organic carboxylic acids typically containing from 4 to 36 carbon atoms. Examples of such stabilizers are carboxylic acid functional aliphatic and aromatic hydrocarbons. Some of the commonly used dispersants are alkyl carboxylic acids such as butyric acid, hexanoic acid, dodecanoic acid, stearic acid and oleic acid. The dispersant is typically present in an amount of 0.1 to 2.5 percent by weight based on weight of the metallic particle and adsorbed dispersant.

The liquid diluent is typically an organic material such as hydrocarbons, alcohols, glycols, esters and ketones. Examples include hexane, octane, toluene, xylene, methanol, ethanol, butanol, ethylene glycol, butyl acetate and methylethylketone.

The organophosphorus acid present in the composition can be an organophosphoric acid, an organophosphonic acid and/or an organophosphinic acid, including various mixtures thereof.

Examples of monomeric phosphoric acids are compounds or a mixture of compounds having the following structure:

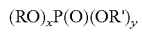

wherein x is 1-2, y is 1-2 and x+y=3, R is a radical having a total of 1-30, preferably 6-18 carbons, where R' is H, a metal such as an alkali metal, for example, sodium or potassium, alkyl including substituted alkyl having 1 to 50 carbons, preferably 1 to 4 carbons such as methyl or ethyl, including substituted aryl having 6 to 50 carbons; preferably, a portion of R' is H. The organic component of the phosphoric acid (R)

can be aliphatic, e.g., alkyl having 2-20 carbon atoms, or can be aromatic containing from 6-18 carbon atoms. Preferably, at least one of the organo groups contains an omega substituent as described below.

Example of monomeric phosphonic acids are compounds or a mixture of compounds having the formula:

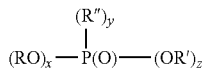

wherein x is 0-1, y is 1, z is 1-2 and x+y+z is 3. Preferably, R and R" are each independently a radical having a total of 1-30, preferably 6-18 carbons. R' is H, a metal, such as an alkali metal, for example, sodium or potassium or an amine or alkyl including substituted alkyl having 1 to 50 carbon atoms, preferably lower alkyl having 1-4 carbons such as methyl or ethyl, or aryl including substituted aryl having 6 to 50 carbons. Preferably at least a portion of R' is H. The organic component of the phosphonic acid (R and R") can be aliphatic, e.g., alkyl having 2-20 carbon atoms, or aromatic containing from 6-18 carbon atoms. Preferably, at least one of the organo groups contains an omega substituent as described below.

Example of monomeric phosphinic acids are compounds or a mixture of compounds having the formula:

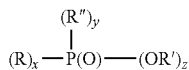

wherein x is 0-2, y is 0-2, z is 1 and x+y+z is 3. Preferably, R and R" are each independently radicals having a total of 1-30, preferably 6-18 carbons. R' is H, a metal, such as an alkali metal, for example, sodium or potassium or an amine or alkyl including substituted alkyl having 1 to 50 carbon atoms, preferably lower alkyl having 1-4 carbons, such as methyl or ethyl, or aryl including substituted aryl having 6 to 50 carbons. Preferably a portion of R' is H. The organic component of the phosphinic acid (R and R") can be aliphatic, e.g., alkyl having 2-20 carbon atoms, or aromatic containing from 6-18 carbon atoms. Preferably, at least one of the organo groups contains an omega substituent as described below.

Examples of omega substituents include carboxyl such as carboxylic acid, hydroxyl, amino, imino, amido, thio and phosphonic acid.

Representative of the organophosphorus acids are as follows: amino trismethylene phosphonic acid, aminobenzylphosphonic acid, 3-aminopropyl phosphonic acid, O-aminophenyl phosphonic acid, aminophenylphosphonic acid, aminophosphonobutyric acid, aminopropylphosphonic acid, 3-hydroxypropyl phosphonic acid 4-mercaptobutyl phosphonic acid, 4-carboxybutyl phosphonic acid, carboxyethylphosphonic acid, 16 phosphonohexadecanoic acid, ethylidenediphosphonic acid, dodecyl bis-1,12-phosphonic acid.

The metallic nanoparticles (including dispersant) are typically present in the conductive inks in amounts of about 5 to 80, such as 10 to 70 percent by weight. The diluent is present in amounts of 10 to 80, such as 20 to 70 percent by weight. The organophosphonic acid is present in amounts of 0.0005 to 5, such as 0.001 to 10 percent by weight. The percentages by weight are based on the total weight of the conductive ink.

The conductive inks of the present invention are the firing type as opposed to the polymer type. This means the conductive inks contain little if any resin or polymer. Preferably the conductive inks are resin or polymer free, and if present, resin or polymer is present in an amount no greater than 10 percent by weight based on weight of conductive ink. The conductive inks can contain other optional ingredients such as a defoaming agents, viscosity controlling agents, dyes and wetting agents. When present, the optional ingredients usually do not exceed 20 percent by weight based on total weight of the conductive ink.

The conductive inks can be deposited upon a substrate by conventional techniques to form a continuous film or layer or can be applied in the form of a pattern. Examples of deposition techniques include screen/stencil printing, inkjet printing, gravure printing, flexographic printing, offset printing, microcontact printing, stamping, spin coating, spray coating, dip coating, roll coating and casting.

After the coating or layer is deposited, it is dried typically at a temperature between 80 and 150° C. for approximately 5 seconds to 30 minutes to remove solvent. After drying, the coating is heated to a higher temperature such as 180 to 400° C. for approximately 5 to 60 minutes to release the dispersant and allow for sintering of the metallic nanoparticles to occur, resulting in the formation of a conductive film or pattern. The film or pattern typically has a thickness less than 1 micron, such as 0.1 to 0.8 micron, and a resistivity of not more than $5 \times 10^{-4}$ ohm cm and typically less than $1 \times 10^{-5}$ ohm cm.

The substrate to which the conductive ink is applied can be a rigid or flexible substrate and can be conductive or nonconductive. Examples include silicon, glass, including metal oxide coated glass, and plastics such as polyimides, liquid crystalline polymers and polyesters. Preferably the substrate has groups which are coreactive with the phosphorus acid groups of the organophosphorus acid or with omega substituents associated with such organophosphorus acids as described more fully below.

The adhesion of the film or pattern to the substrate is excellent when compared to a film or pattern deposited from conductive inks which do not contain the organophosphonic acids. As shown in the examples that follow, this can be demonstrated by testing the adhesion of the conductive ink to a rigid substrate such as glass and indium tin oxide coated glass substrate by the tape adhesion test.

Although not intending to be bound by any theory, it is believed that the phosphorus acid group of the organophosphorus acid is reactive with coreactive groups on the substrate such as imido groups, oxide groups and hydroxyl groups forming covalent bonds therewith. The omega groups are reactive with the surface of the metal nanoparticle such as carboxylic acid groups being reactive with silver. During the heating step, the dispersant is at least partially removed from the metal nanoparticle, for example, with a carboxylic acid dispersant on a silver nanoparticle, the carboxylic acid decarbonylates, and the omega carboxylic acid groups of the organophosphorus acid bond to the sintered silver layer. As mentioned above, the phosphorus acid groups bond to the substrate resulting in excellent adhesion between the silver layer and the substrate. Also, it is possible depending on the selection of the substrate, metal nanoparticles and omega substituents of the organophosphorus acid, the phosphorus acid moiety could bond to the sintered metal layer and the omega substituent bind to the substrate. What is important is that the organophosphorus acid acts as a coupling agent between the sintered metal layer and the substrate and forms bonds with both the sintered metal layer and the substrate either by strong adsorption forces or preferably by ionic or covalent bonding.

The process of the invention can be used to prepare conductive electrodes, conductive pads, conductive lines, conductive tracks and the like in electronic devices such as thin film transistors, organic light emitting diodes, RFID (radio frequency identification) tags, photovoltaic and other electronic devices which require conductive elements or components.

EXAMPLES

Exemplary embodiments of the present invention will now be described in more detail. These examples are provided only for illustrating the present invention and should not be considered as limiting the scope of the invention.

A conductive ink available from Cabot as CS-32 comprised approximately 20% stearic acid-functionalized silver nanoparticles dispersed in 40% ethanol/40% ethylene glycol. The percentages are by weight based on weight of conductive ink. This is considered the "control" ink formulation. To the control various omega functionalized phosphonic acids were added at 0.5% loadings (based on weight of the resultant ink) then stirred to disperse the phosphonic acid. "SAMP/Ink #1" contained 16-phosphonohexadecanoic acid. "SAMP/Ink #2" contained 4-mercaptobutylphosphonic acid and "SAMP/Ink #3" contained 12-dodecylbisphosphonic acid.

The inks were deposited on both glass and indium tin oxide coated glass substrates by applying by spin coating 0.3 ml on a 2"×2" substrate then spinning the substrate at 2000 rpm for 30 seconds followed by a 15 second soft bake at 150° C. to remove solvents. A final bake at 200° C. for 30 minutes was used to release the fatty acid binder and sinter the silver nanoparticles while simultaneously bonding the sintered silver layer to the substrate via the organophosphonic acid.

Adhesion was tested by cutting a 6×6 crosshatch into the silver layer (approx. 2 mm×2 mm lattice), applying Scotch 610 tape firmly then quickly pulling off at a 180 degree angle with significant force. Adhesion was judged on a 0-100% scale as the amount of retained silver on the crosshatch area after testing. Further testing was done by immersing the same substrate (after initial tape peel testing) in pure water for 10 minutes followed by tape peel testing; if samples performed well they were then subsequently exposed to isopropanol for 10 minutes then tape peel tested and then soapy water for 10 minutes and tape peel tested. The results of the testing are reported below.

| Substrate | Ink | Tape Peel #1 (after curing) | Tape Peel #2 (H$_2$O) | Tape Peel #3 (IPA) | Tape Peel #4 (soapy water) | Comments |
|---|---|---|---|---|---|---|
| Glass/ITO | Control | 0% | — | — | — | Poor adhesion |
| Glass | Control | 0% | — | — | — | Poor adhesion |
| Glass/ITO | SAMP/Ink #1 | 100% | 100% | 100% | 100% | Excellent adhesion |
| Glass | SAMP/Ink #1 | 100% | 100% | 100% | 100% | Excellent adhesion |
| Glass/ITO | SAMP/Ink #2 | 80% | 60% | 60% | 50% | Good adhesion |
| Glass | SAMP/Ink #2 | 80% | 60% | 60% | 50% | Good adhesion |
| Glass/ITO | SAMP/Ink #3 | 100% | 100% | 100% | 100% | Excellent adhesion |
| Glass | SAMP/Ink #3 | 100% | 100% | 100% | 100% | Excellent adhesion |

What is claimed is:

1. An electroconductive ink comprising:
   (a) a dispersion of metal nanoparticles with a dispersant on the surface of the metal nanoparticles and as a separate component,
   (b) an omega substituted organophosphorus acid;
   the metal nanoparticles being present in amounts of 5 to 80 percent by weight and the omega substituted organophosphorus acid being present in amounts of 0.0005 to 5 percent by weight; the percentages by weight being based on total weight of the electroconductive ink.

2. The composition of claim 1 in which the metal is selected from copper, silver, palladium, gold or any combination thereof.

3. The composition of claim 2 in which the metal is silver.

4. The composition of claim 3 in which the dispersant is an organic carboxylic acid.

5. The composition of claim 4 in which the organocarboxylic acid contains from 4 to 36 carbon atoms.

6. The composition of claim 1 in which the metal nanoparticles have a particle size of 1 to 500 nanometers.

7. The composition of claim 1 in which the dispersion contains an organic diluent.

8. The composition of claim 7 in which the organic diluent is selected from hydrocarbons, alcohols, esters and ketones.

9. The composition of claim 1 in which the organo groups of the organophosphorus acid have omega substituted functional groups.

10. The composition of claim 1 in which the omega substituted functional groups are selected from phosphonic acid, carboxylic acid, hydroxyl, thiol and amine including various combinations thereof.

11. An electroconductive ink comprising:
   (a) a dispersion of silver nanoparticles with an organocarboxylic acid dispersant on the surface of the silver nanoparticles and as a separate component,
   (b) an omega substituted organophosphorus acid;
   the silver nanoparticles being present in amounts of 10 to 70 percent by weight and the omega substituted organophosphorus acid being present in amounts of 0.0005 to 5 percent by weight, the percentages by weight being based on total weight of the electroconductive ink.

12. The electroconductive ink of claim 11 in which the omega substituted organophosphorus acid is a carboxylic acid functional organophosphonic acid.

13. A process for making an electronic device comprising:
   (a) depositing an electroconductive ink upon a substrate, the electroconductive ink comprising:
      (i) a dispersion of metal nanoparticles with a dispersant adsorbed on the surface of the metal nanoparticles and as a separate component
      (ii) an omega substituted organophosphorus acid;
      the metal nanoparticles being present in amounts of 5 to 80 percent by weight and the omega substituted organophosphorus acid being present in amounts of 0.0005 to 5 percent by weight; the percentages by weight being based on total weight of the electroconductive ink;

(b) heating the deposited electroconductive ink at a temperature sufficient to sinter the nanoparticles to form an electrically conductive layer.

14. The process of claim 13 in which the deposition step is selected from the following: screen/stencil printing, gravure printing, flexographic printing, offset printing, stamping, microcontact printing, inkjet printing, spin coating, dip coating, blade coating, spraying and casting.

15. The process of claim 13 in which the substrate is silicon, glass, metal oxide coated glass and plastic.

16. The process of claim 15 in which the substrate is plastic and is selected from polyimides, liquid crystalline polymers and polyesters.

17. The process of claim 13 in which the heating is performed at a temperature of about 180 to 400° C.

18. The process of claim 13 in which the substrate has groups that are reactive with the omega functional groups and/or the phosphorus acid groups.

19. The process of claim 18 in which during the heating step at least a portion of the dispersant is removed from the metal nanoparticles and the acid and/or the omega functional groups bond with the metal nanoparticle and the acid and/or the omega functional groups bond with the reactive groups on the substrate surface.

20. An electronic device made by the process of claim 13.

21. The electronic device of claim 20 in the form of a thin film transistor.

22. A process for making an electronic device comprising:
(a) depositing an electroconductive ink on a substrate;
  (i) the electroconductive ink comprising:
    (1) a dispersion of silver nanoparticles with a dispersant on the surface of the silver nanoparticles,
    (2) an omega functional organophosphorus acid;
    the silver nanoparticles being present in amounts of 10 to 70 percent by weight and the omega substituted organophosphorus acid being present in amounts of 0.0005 to 5 percent by weight; the percentages by weight being based on total weight of the electroconductive ink;
  (ii) the substrate having groups that are reactive with the acid and/or the omega functional groups;
(b) heating the deposited composition to a temperature sufficient to remove at least a portion of the dispersant from the surface of the silver nanoparticles and to cause the coalescing silver nanoparticles to bond to the acid and/or the omega functional groups of the organophosphorus acid and the groups of the substrate to bond with the acid and/or the omega groups of the organophosphorus acid in forming an electroconductive layer.

23. An electrical device comprising an electrically conductive layer comprising metal nanoparticles sintered together and bonded to a substrate with an omega functional phosphorus acid in which the sintered silver is bonded to the omega functional organophosphorus acid through the acid and/or the omega functional groups and in which the substrate is bonded to the omega functional organophosphorus acid through the acid and/or the omega functional groups.

* * * * *